US012787463B2

(12) United States Patent
Liu

(10) Patent No.: US 12,787,463 B2
(45) Date of Patent: Nov. 3, 2026

(54) CMOS IMAGE SENSOR AND METHOD FOR FORMING THE SAME

(71) Applicant: HUA HONG SEMICONDUCTOR (WUXI) LIMITED, Wuxi (CN)

(72) Inventor: Junwen Liu, Wuxi (CN)

(73) Assignee: HUA HONG SEMICONDUCTOR (WUXI) LIMITED, Jiangsu (CN)

( * ) Notice: Subject to any disclaimer, the term of this patent is extended or adjusted under 35 U.S.C. 154(b) by 733 days.

(21) Appl. No.: 18/106,209

(22) Filed: Feb. 6, 2023

(65) Prior Publication Data

US 2023/0253437 A1 Aug. 10, 2023

(30) Foreign Application Priority Data

Feb. 10, 2022 (CN) ........................ 202210125867.4

(51) Int. Cl.
*H10F 39/18* (2025.01)
*H10F 39/00* (2025.01)

(52) U.S. Cl.
CPC ........... *H10F 39/18* (2025.01); *H10F 39/011* (2025.01); *H10F 39/014* (2025.01); *H10F 39/8033* (2025.01); *H10F 39/8037* (2025.01); *H10F 39/80373* (2025.01); *H10F 39/807* (2025.01)

(58) Field of Classification Search
CPC ......... H10F 39/014; H10F 39/18–1898; H10F 39/8033; H10F 39/8037–80377; H10F 39/807
See application file for complete search history.

(56) References Cited

U.S. PATENT DOCUMENTS

2005/0167704 A1 8/2005 Ezaki et al.
2011/0127592 A1* 6/2011 Yanagita ............ H10F 39/8037 257/E31.085
2016/0020237 A1 1/2016 Yamakawa
2016/0284746 A1* 9/2016 Fukase .............. H10F 39/80373
2018/0366508 A1* 12/2018 Goto ..................... H10F 39/018
2018/0374890 A1* 12/2018 Cao ......................... H10F 39/18
2021/0193713 A1 6/2021 Lim et al.
2024/0379699 A1* 11/2024 Nakazaki .......... H10F 39/80377

FOREIGN PATENT DOCUMENTS

CN 103346161 A 10/2013
CN 110416185 A 11/2019

OTHER PUBLICATIONS

Chinese Office Action for Application No. 202210125867.4 issued Jun. 20, 2025 (13 pages).

* cited by examiner

*Primary Examiner* — Kevin Parendo
(74) *Attorney, Agent, or Firm* — Boyle Fredrickson S.C.

(57) ABSTRACT

A CMOS image sensor and a method for forming the CMOS image sensor are provided. The method includes: forming a substrate structure and a photosensitive doped layer, wherein the substrate structure includes a plurality of pixel regions which are mutually discrete, and the photosensitive doped layer is disposed in a pixel region; and forming a switching device on the photosensitive doped layer. The switching device is formed on the photosensitive doped layer in a stacked manner. Therefore, an area of the pixel region can be reduced and a pixel density can be improved, and a size of the photosensitive region and a size of the reading circuit can be balanced, which is conducive to obtaining better photosensitive characteristics and switching performance.

10 Claims, 6 Drawing Sheets

CMOS IMAGE SENSOR AND METHOD FOR FORMING THE SAME

CROSS-REFERENCE TO RELATED APPLICATIONS

This application claims the priority to Chinese Application No. 202210125867.4, filed on Feb. 10, 2022, and entitled "CMOS IMAGE SENSOR AND METHOD FOR FORMING THE SAME", the content of which is incorporated herein by reference in their entirety.

TECHNICAL FIELD

The present disclosure relates to the field of semiconductor manufacturing, and more particularly, to a CMOS image sensor and a method for forming the CMOS image sensor.

BACKGROUND OF THE INVENTION

Image sensors are devices which can convert optical signals into electrical signals and have been broadly applied in digital televisions market and video communication market. Among them, CCD (Charge-Coupled Device) and CMOS (Complementary Metal Oxide Semiconductor) are widely used, in which CMOS has attracted the most attention and is considered to have the greatest development potential.

With the development of the technology of CMOS image sensor (CIS) products, higher and higher requirements are put forward on pixels of image sensors. Generally, a single pixel of a CMOS image sensor is composed of a photosensitive region (a PN junction as a photosensitive region) and a reading circuit (a transistor device as a selection switch). The larger the photosensitive region, the better the photosensitivity is. Moreover, the larger the transistor size, the less noise the switch makes, and the more stable performance the transistor may have. Therefore, under a same pixel density, it needs to balance a size of the photosensitive region and a size of the reading circuit.

Therefore, there is a need to improve CMOS image sensor structures in conventional technology.

SUMMARY OF THE INVENTION

According to some embodiments of the present disclosure, a CMOS image sensor and a method for forming the CMOS image sensor are provided. Performance of the CMOS image sensor manufactured by the method can be improved.

For solving the problem above, some embodiments of the present disclosure provide a CMOS image sensor which includes: a substrate including a plurality of pixel regions which are mutually discrete; a photosensitive doped layer which is disposed in a pixel region; and a switching device which is disposed on the photosensitive doped layer.

According to some embodiment, the switching device includes: an active area disposed on a part of the photosensitive doped layer, and a gate disposed above and surrounding the active area and above a part of the photosensitive doped layer. A source/drain layer is formed at the top of the active area, and the gate is provided with an opening which exposes a part of the source/drain layer.

According to some embodiment, a lightly doped region is disposed at the top of the source/drain layer, and the opening exposes a part of the lightly doped region.

According to some embodiment, the CMOS image sensor further includes a conductive plug disposed on the source/drain layer.

According to some embodiment, the CMOS image sensor further includes an isolation structure which is disposed between adjacent pixel regions and between adjacent switching devices.

According to some embodiment, the substrate includes a first region and a second region, the plurality of pixel regions are disposed in the first region, and a peripheral device is disposed in the second region.

Accordingly, the present disclosure also provides an embodiment of a method for forming a CMOS image sensor. The method includes: forming a substrate structure and forming a photosensitive doped layer, wherein the substrate structure includes a plurality of pixel regions which are mutually discrete, and the photosensitive doped layer is disposed in a pixel region; and forming a switching device on the photosensitive doped layer.

According to some embodiment, the switching device includes: an active area disposed on a part of the photosensitive doped layer, and a gate disposed above and surrounding the active area and above a part of the photosensitive doped layer. A source/drain layer is formed at the top of the active area, and the gate is provided with an opening which exposes a part of the source/drain layer.

According to some embodiment, the substrate structure includes a substrate and an initial photosensitive doped layer disposed on the substrate, and a method for forming a plurality of photosensitive doped layers includes: forming a plurality of isolation structures in the substrate structure, wherein each of the plurality of isolation structures penetrates the initial photosensitive doped layer and is respectively disposed between adjacent pixel regions to form the plurality of mutually discrete photosensitive doped layers.

According to some embodiment, the substrate structure also includes an initial well doped layer disposed on the initial photosensitive doped layer, and each of the plurality of isolation structures penetrates the initial well doped layer to form a plurality of well doped layers which are mutually discrete.

According to some embodiment, a method for forming the substrate structure includes: providing an initial substrate; and implanting first doping ions into the initial substrate to form the initial photosensitive doped layer in the initial substrate, the part of the initial substrate disposed under the initial photosensitive doped layer constitutes the substrate, and the part of the initial substrate disposed on the initial photosensitive doped layer constitutes the initial well doped layer.

According to some embodiment, a method for forming the substrate structure includes: providing an initial substrate; implanting first doping ions into the surface part of the initial substrate to form the initial photosensitive doped layer, wherein the initial photosensitive doped layer is located at the top surface of the initial substrate; forming an epitaxial layer on the top surface of the initial photosensitive doped layer to form the active area; and implanting second doping ions into the epitaxial layer to form the initial well doped layer.

According to some embodiment, a method for forming a switching device includes: etching a well doped layer until a photosensitive doped layer is exposed to form a gate trench, wherein a part of the well doped layer constitutes the active area, and the active area and an isolation structure are exposed by the gate trench; forming the gate in the gate trench and above the active area and forming an opening in the gate, wherein the opening exposes a part of the top surface of the active area; and implanting first ions into the opening to form the source/drain layer.

According to some embodiment, a method for forming the gate and the opening includes: forming an initial gate in the gate trench and above the active area; and etching back the initial gate until a surface of the isolation structure and a part of the surface of the active area are exposed to form the gate and the opening.

According to some embodiment, the method further includes: forming a gate dielectric layer on surfaces of the gate trench and on the active area before forming the initial gate.

According to some embodiment, the method further includes: implanting second ions into a surface layer of the well doped layer to form an initial lightly doped region before etching the well doped layer; and forming a lightly doped region after etching the initial lightly doped region.

According to some embodiment, a process for forming the initial lightly doped region includes: implanting N-type ions, and the dose of doping ions ranges from 5E12 atom/$cm^2$ to 5E14 atom/$cm^2$.

According to some embodiment, the method further includes: after forming the switch devices, forming a conductive plug on the source/drain layer.

According to some embodiment, the method further includes: forming spacers on opposite side walls of the gate before forming the conductive plug.

According to some embodiment, the substrate structure includes a first region and a second region, the plurality of pixel regions are disposed in the first region, and a peripheral device is formed in the second region.

Compared with the conventional technology, the present disclosure has the following beneficial effects.

According to some embodiments of the present disclosure, a switching device is formed on a photosensitive doped layer in a stacked manner. Therefore, an area of a pixel region can be reduced and a pixel density can be improved, and a size of the photosensitive region and a size of the reading circuit can be balanced, which is conducive to obtaining better photosensitive characteristics and switching performance.

Further, second ions are implanted into a surface layer of a well doped layer to form a lightly doped region before the well doped layer is etched, and the lightly doped region is disposed on a source/drain layer below a gate. A low doping concentration is used to reduce the short channel effect of the switching device.

Further, a conductive plug is formed on the source/drain layer. A plurality of conductive plugs disposed in the plurality of pixel regions are configured along an extension direction of the plurality of photosensitive doped layers. The plurality of conductive plugs are conducive to reducing contact resistance and improving device performance.

According to the CMOS image sensor in some embodiments of the present disclosure, a switching device is formed on a photosensitive doped layer in a stacked manner. Therefore, an area of a pixel region can be reduced and a pixel density can be improved, and a size of the photosensitive region and a size of the reading circuit can be balanced, which is conducive to obtaining better photosensitive characteristics and switching performance.

DETAILED DESCRIPTION OF THE EMBODIMENTS

It should be noted that the "surface" and "on" in this description are used to describe relative position relationships in space, and are not limited to direct contact.

As mentioned in the background, for CMOS image sensors in conventional technology, with a same pixel density, it needs to balance a size of the photosensitive region and a size of the reading circuit. Therefore, there is a need to improve CMOS image sensors in conventional technology.

For solving the problem above, the present disclosure provides a CMOS image sensor and a method for forming the CMOS image sensor. A switching device is formed on a photosensitive doped layer in a stacked manner. Therefore, an area of a pixel region can be reduced and a pixel density can be improved, and a size of the photosensitive region and a size of the reading circuit can be balanced, which is conducive to obtaining better photosensitive characteristics and switching performance.

Various additional objects, features and beneficial effects of the present disclosure can be more fully appreciated with reference to the detailed description and accompanying drawings that follow.

FIG. 1 to FIG. 12 schematically illustrate intermediate structural diagrams according to a method for forming a CMOS image sensor in some embodiments of the present disclosure.

In some embodiments, a substrate structure and a photosensitive doped layer are formed. The substrate structure includes a plurality of pixel regions which are mutually discrete, and the photosensitive doped layer is disposed in a pixel region. Referring to FIG. 1 to FIG. 4, a specific process for forming the substrate and the photosensitive doped layer is shown.

Figure 1:
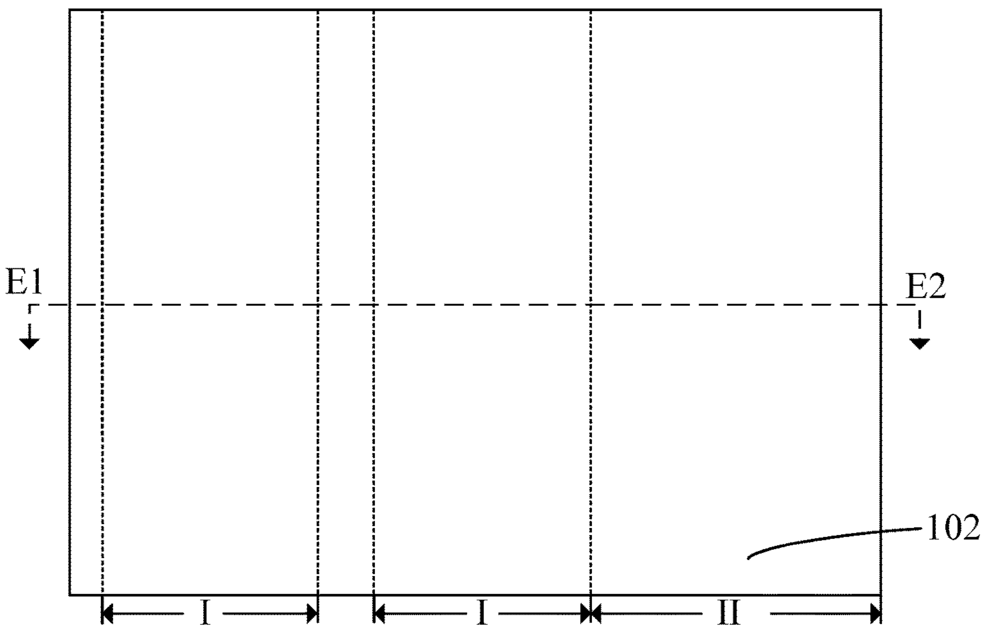
FIG. 1 to FIG. 12 schematically illustrate intermediate structural diagrams according to a method for forming a CMOS image sensor in some embodiments of the present disclosure.
Figure 2:
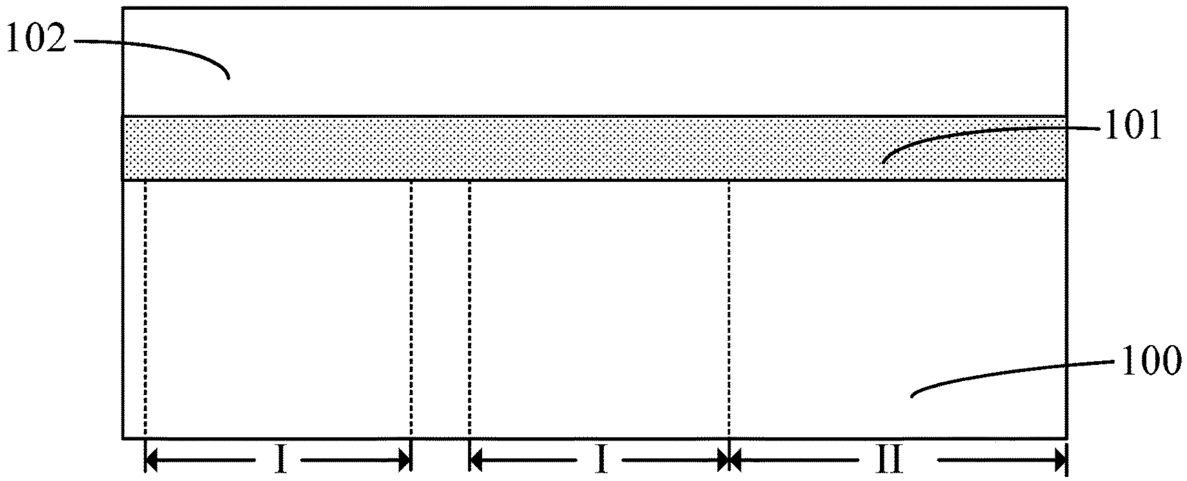

Referring to FIG. 1 and FIG. 2, FIG. 1 schematically illustrates a structural diagram in a top view, and FIG. 2 schematically illustrates a section structural diagram along the direction of EE1 in FIG. 1. A substrate structure is formed, and the substrate structure includes a substrate 100 and an initial photosensitive doped layer 101 disposed on the substrate 100.

In some embodiment, the substrate structure includes a first region and a second region II, and the plurality of pixel regions I which are mutually discrete and are disposed in the first region.

In some embodiment, a peripheral device is subsequently formed in the second region II.

In some embodiment, the substrate structure also includes an initial well doped layer 102 disposed on the initial photosensitive doped layer 101.

In some embodiment, a method for forming the substrate structure includes: providing an initial substrate (not shown in figures); implanting first doping ions into the surface part of the initial substrate to form the initial photosensitive doped layer 101, wherein the initial photosensitive doped layer 101 is located at the top surface of the initial substrate; forming an epitaxial layer (not shown in figures) on the top surface of the initial photosensitive doped layer 101 to form the active area; and implanting second doping ions into the epitaxial layer to form the initial well doped layer 102.

In some embodiment, a conductivity type of the initial substrate is P-type, a conductivity type of the first doping ions is N-type, and a conductivity type of the second doping ions is P-type. A PN junction is formed between the initial photosensitive doped layer 101 and the initial substrate to form a photo diode. The epitaxial layer is used to form a channel of the switching device.

In some embodiment, a well doped layer 105 in the first region and a well doped layer 105 in the second region II may be formed simultaneously. In some embodiment, a well doped layer in the first region and a well doped layer in the second region may be formed at different steps, which may result in a difference in doping ions or a concentration of doping ions between the well doped layer in the first region and the well doped layer in the second region.

The well doped layer 105 in the first region is used to form a well region of the switching device. The well doped layer 105 in the second region II is used to form a well region of a peripheral device.

Figure 3:
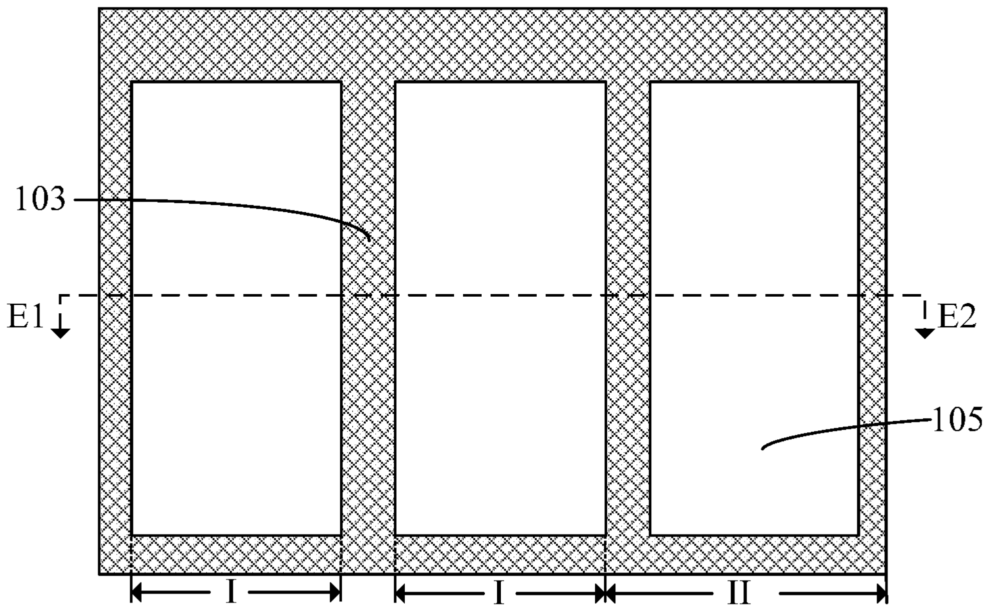
Figure 4:
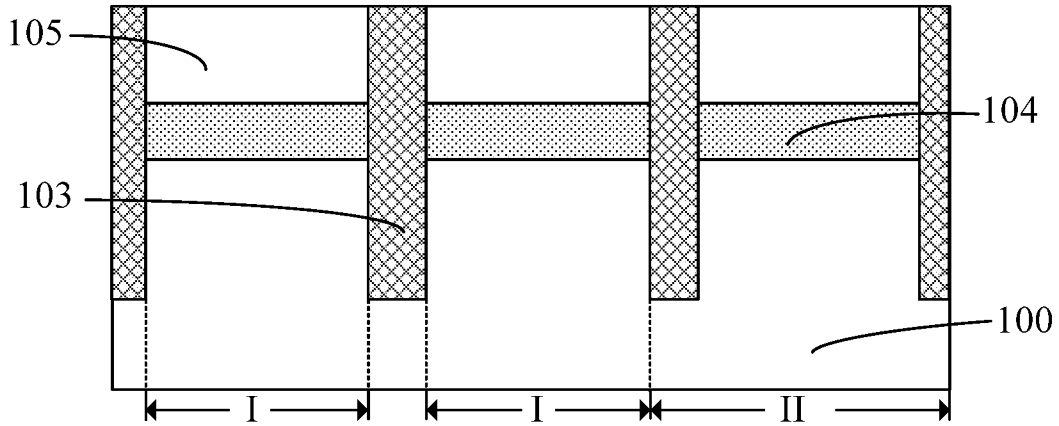

Referring to FIG. 3 and FIG. 4, FIG. 3 schematically illustrates a structural diagram in a top view, and FIG. 4 schematically illustrates a section structural diagram along the direction of EE1 in FIG. 3. A plurality of isolation structures 103 are formed in the substrate structure, and each of the plurality of isolation structures 103 penetrates the initial photosensitive doped layer 101 and is respectively disposed between adjacent pixel regions I to form a plurality of photosensitive doped layers 104 which are mutually discrete.

In some embodiment, each of the plurality of isolation structures 103 penetrates the initial well doped layer 102 to form a plurality of well doped layers 105 which are mutually discrete.

A method for forming an isolation structure 103 includes: etching the substrate structure to form an isolation trench in the substrate structure (not shown in figures); forming an insulating dielectric material layer (not shown in figures) in the isolation trench and on the substrate structure; and planarizing the insulating dielectric material layer until the surface of the substrate structure is exposed to form the isolation structure 103.

In some embodiment, a method for forming the substrate structure includes: providing an initial substrate; and implanting first doping ions into the initial substrate to form the initial photosensitive doped layer in the initial substrate, wherein the implanted part is close to the inner part of the initial substrate. The part of the initial substrate disposed under the initial photosensitive doped layer constitutes the substrate, and the part of the initial substrate disposed on the initial photosensitive doped layer constitutes the initial well doped layer.

Subsequently, the switching device is formed on the photosensitive doped layer 104.

In some embodiment, a switching device includes: an active area disposed on a part of a photosensitive doped layer 104, and a gate disposed above and surrounding the active area and above a part of the photosensitive doped layer. A source/drain layer is formed at the top of the active area, and the gate is provided with an opening which exposes a part of the source/drain layer. Specifically, referring to FIG. 5 to FIG. 10, a process for forming the switching device is shown.

Figure 5:
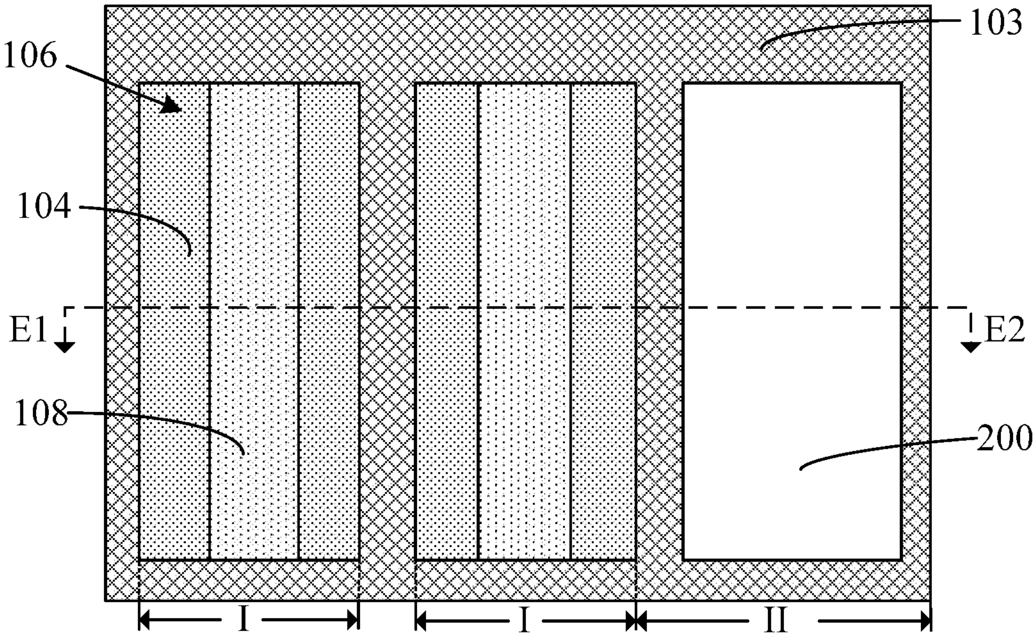
Figure 6:
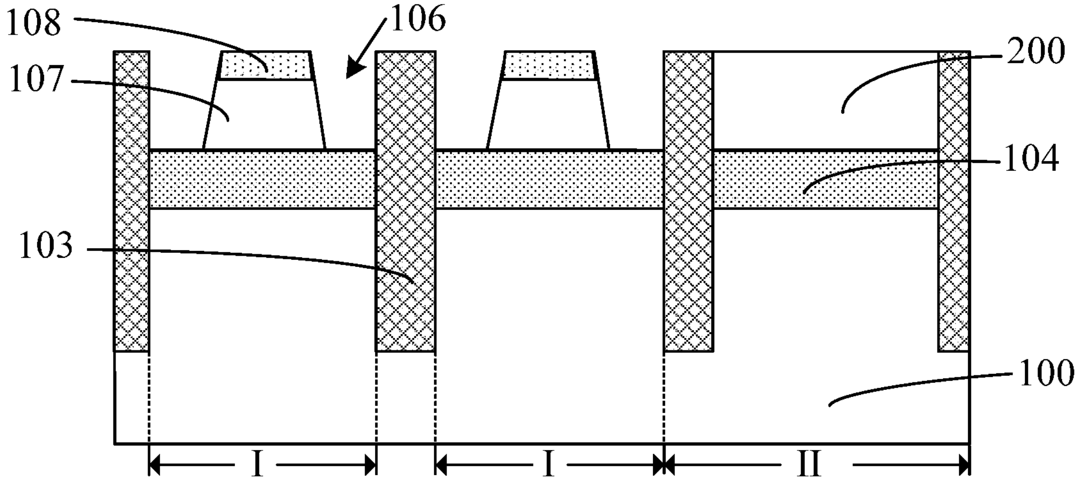

Referring to FIG. 5 and FIG. 6, FIG. 5 schematically illustrates a structural diagram in a top view, and FIG. 6 schematically illustrates a section structural diagram along the direction of EE1 in FIG. 5. A well doped layer 105 is etched until a photosensitive doped layer 104 is exposed to form a gate trench 106 and the active area 107. The gate trench 106 exposes the active area 107 and the isolation structure 103.

Specifically, the well doped layer 105 in the pixel region I is etched until the photosensitive doped layer 104 is exposed to form the gate trench 106, and a part of the active area 107 constitutes the active area 107. The gate trench 106 exposes the active area 107 and the isolation structure 103.

In some embodiment, the well doped layer 105 in the second region II is etched to form a well region 200 of a peripheral device.

More specifically, a method for forming the gate trench 106 and the active area 107 also includes: forming a first patterned layer (not shown in figures) on a surface of the well doped layer 105, wherein the first patterned layer exposes a part of a surface of the pixel region I; and etching the well doped layer 105 in the pixel region I with the first patterned layer as a mask.

In some embodiment, second ions are implanted into a surface layer of the well doped layer 105 to form an initial lightly doped region (not shown in figures) before the well doped layer 105 is etched; and a lightly doped region 108 is formed after the initial lightly doped region is etched.

The lightly doped region 108 is disposed on the source/drain layer below a subsequently formed gate. A low doping concentration is used to reduce the short channel effect of the switching device.

Specifically, the second ions are implanted into the surface layer of the well doped layer 105 in the pixel region I to form an initial lightly doped region.

More specifically, a method for forming the initial lightly doped region also includes: forming a second patterned layer (not shown in figures) on the substrate 100 before implanting the second ions, wherein the second patterned layer exposes a surface of the well doped layer 105 in the pixel region I; and removing the second patterning layer after forming the initial lightly doped region.

In some embodiment, a process for forming the initial lightly doped region includes: implanting doping ions including N-type ions, and the dose of doping ions ranges from 5E12 atom/$cm^2$ to 5E14 atom/$cm^2$. Specifically, the N-type ions are phosphorus. In some other embodiment, the doping ions are arsenic.

In some embodiment, a concentration of the initial lightly doped region ranges from 1E18 atom/$cm^3$ to 1E21 atom/$cm^3$, and a doped depth of the initial lightly doped region ranges from 50 nm to 500 nm.

Figure 7:
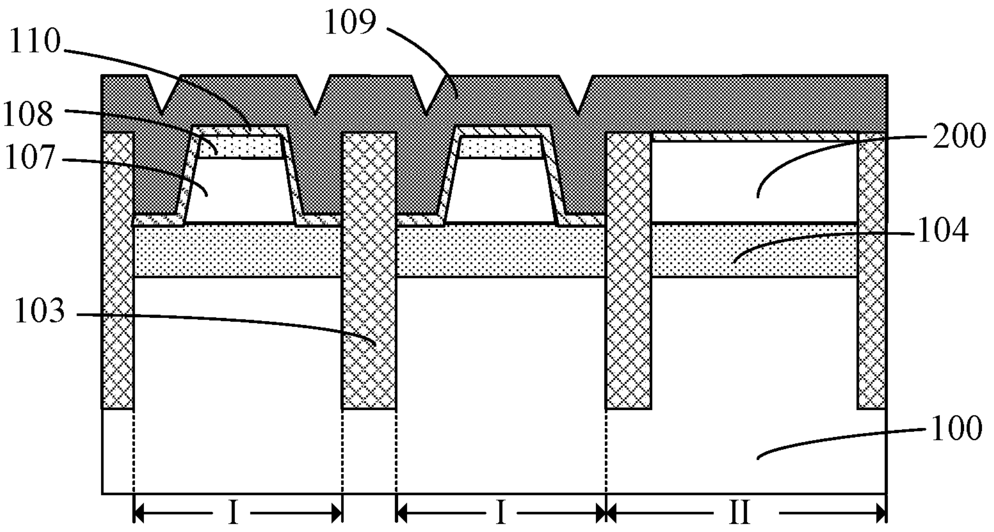
Figure 8:
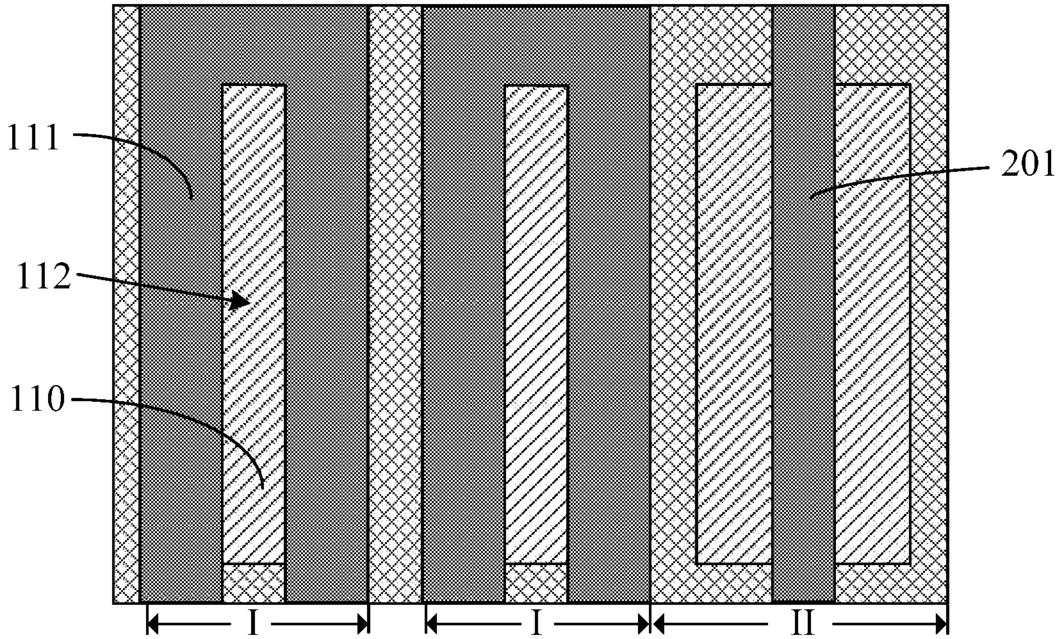
Figure 9:
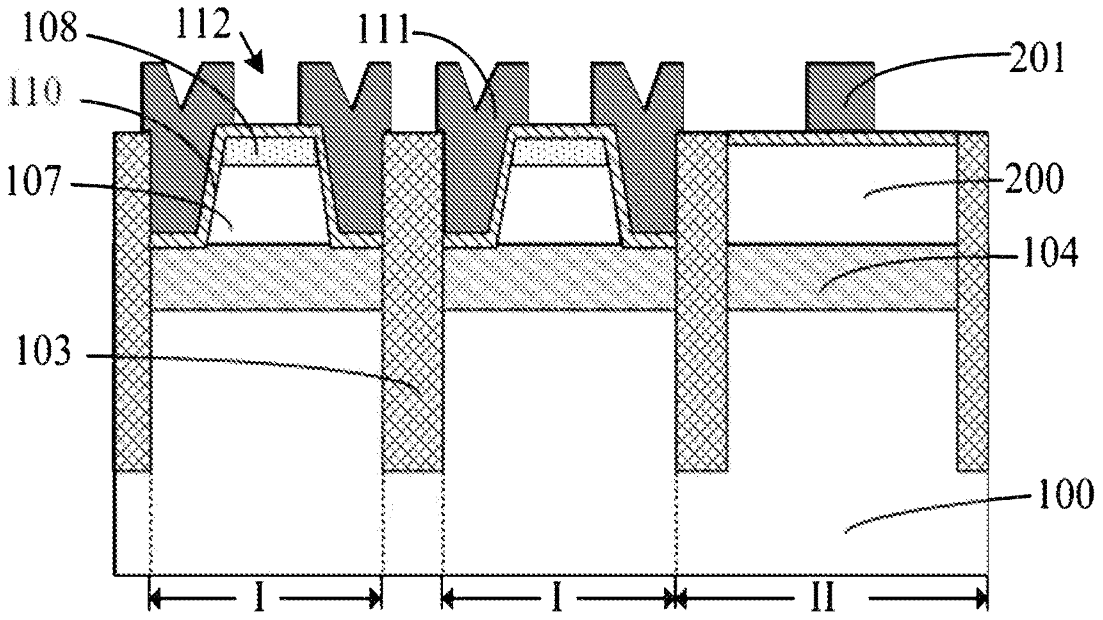

Subsequently, a gate is formed in the gate trench 106 and above the active area 107 and an opening is formed in the gate. The opening exposes a part of the surface of the active area 107. Referring to FIG. 7 to FIG. 9, a method for forming the gate and the opening is shown.

Referring to FIG. 7, a view direction in FIG. 7 is the same as that in FIG. 6. An initial gate 109 is formed in the gate trench 106 and above the active area 107.

In some embodiment, before the initial gate 109 is formed, a gate dielectric layer 110 is formed in the gate trench 106 and on the active area 107.

Specifically, the gate dielectric layer 110 is also disposed on a surface of the well doped layer 105 in the second region II. The gate dielectric layer 110 in the second region II is used to form a gate dielectric layer of the device in the second region II.

In some embodiment, specifically, the surface of the active area 107 and the surface of the photosensitive doped layer 104 which are exposed by the gate trench 106 are oxidized to form the gate dielectric layer 110.

In some embodiment, the material of the initial gate 109 is polysilicon.

In some embodiment, the initial gate 109 is used to form a gate of the switching device in the pixel region I, and also used to form a peripheral gate of the peripheral device in the second region II.

Referring to FIG. 8 and FIG. 9, FIG. 8 schematically illustrates a structural diagram in a top view, and FIG. 9 schematically illustrates a section structural diagram along the direction of EE1 in FIG. 8. The initial gate 109 is etched back until a surface of the isolation structure 103 and a part of the surface of the active area 107 are exposed to form the gate 111 and the opening 112.

Specifically, the initial gate 109 is etched back until the gate dielectric layer 110 on the surface of the isolation structure 103 and on a part of the surface of the active area 107 are exposed to form the gate 111 and the opening 112.

In some embodiment, the initial gate 109 is etched back, so that a peripheral gate 201 is formed on a part of the well region 200.

Figure 10:
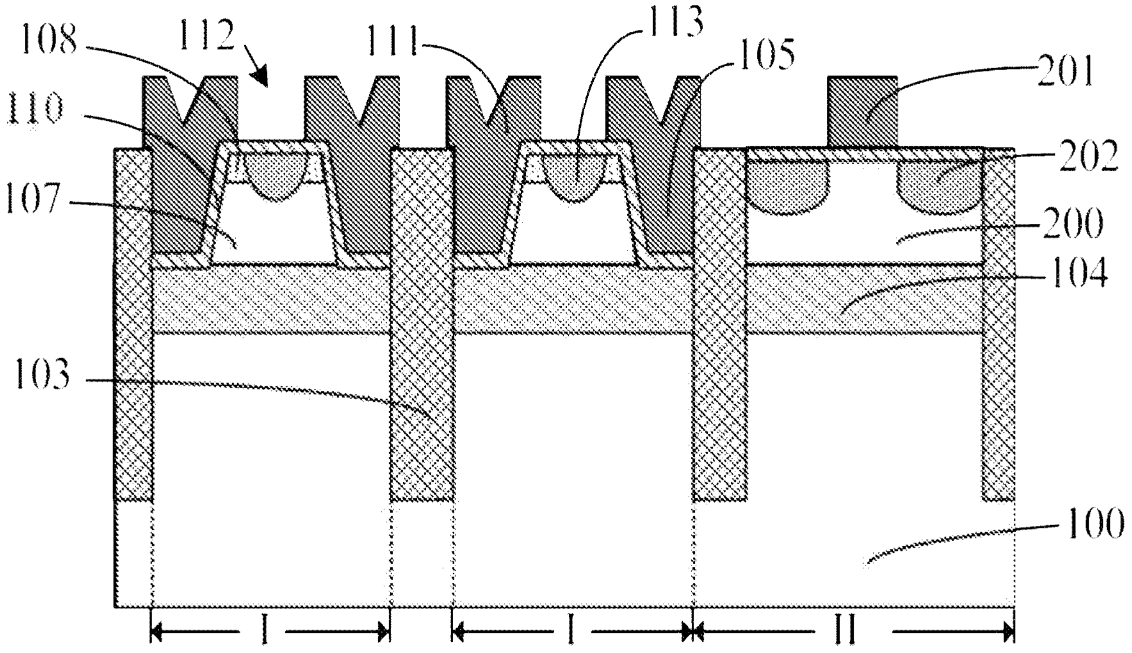

Referring to FIG. 10, a view direction in FIG. 10 is the same as that in FIG. 9. First ions are implanted into the opening 112 to form the source/drain layer 113.

In some embodiment, the first ions are N-type conductive ions. In some embodiment, the first ions are P-type conductive ions.

In this embodiment, a peripheral source/drain region 202 is also formed in the well region 200 of the peripheral device on both sides of the peripheral gate 201 in the second region II.

A switching device includes: an active area 107 disposed on a part of a photosensitive doped layer 104, and a gate 111 disposed above and surrounding the active area 107 and above a part of the photosensitive doped layer 104. A source/drain layer 113 is formed at the top of the active area 107, and the gate 111 is provided with an opening 112 which exposes a part of the source/drain layer 113.

The switching device is formed on a photosensitive doped layer 104 in a stacked manner. Therefore, an area of a pixel region can be reduced and a pixel density can be improved, and a size of the photosensitive region and a size of the reading circuit can be balanced, which is conducive to obtaining better photosensitive characteristics and switching performance.

Figure 11:
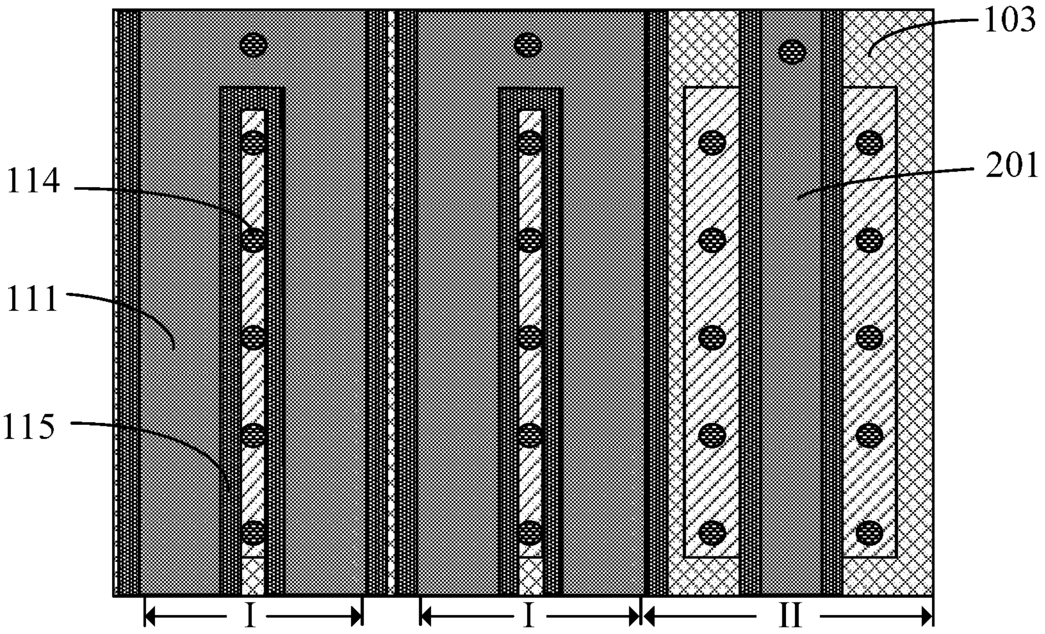
Figure 12:
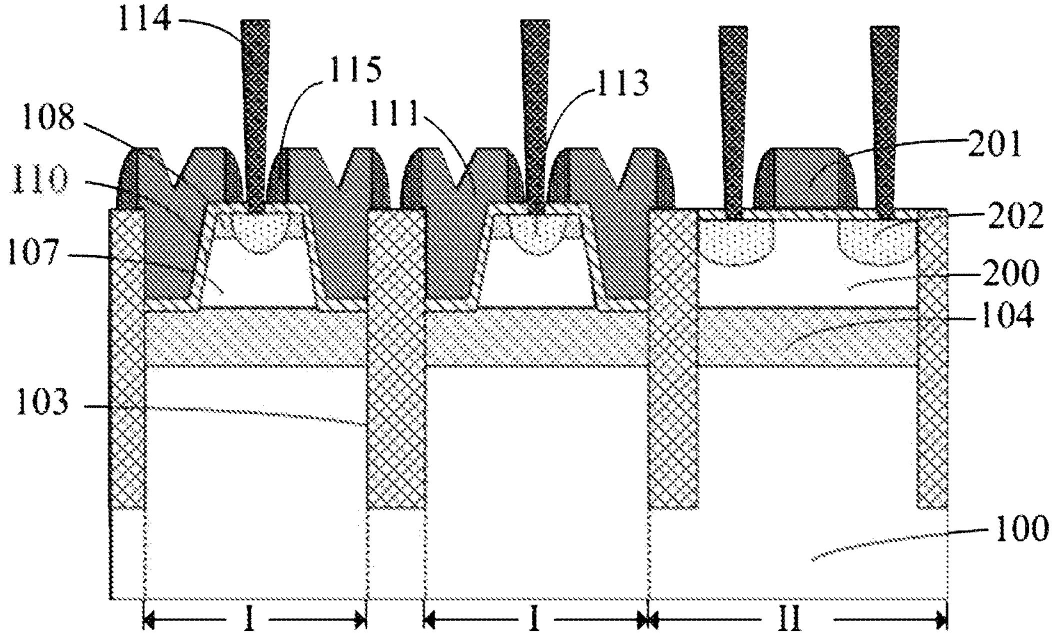

Referring to FIG. 11 and FIG. 12, FIG. 11 schematically illustrates a structural diagram in a top view, and FIG. 12 schematically illustrates a section structural diagram along the direction of EE1 in FIG. 11. After the switch device is formed, a conductive plug 114 is formed on the source/drain layer 113. A plurality of conductive plugs 114 disposed in a plurality of pixel regions are configured along an extension direction of a plurality of photosensitive doped layers 104.

The plurality of conductive plugs 114 disposed in the plurality of pixel regions are configured along an extension direction of the plurality of photosensitive doped layers 104. The plurality of conductive plugs are conducive to reducing contact resistance and improving device performance.

In some embodiment, a method for forming a conductive plug 114 includes: forming a dielectric material layer on the switch device; forming a contact via (not shown in figures) in the dielectric material layer, wherein a bottom of the contact via exposes the source/drain layer 113; and forming the conductive plug 114 in the contact via.

In some embodiment, the plurality of conductive plugs 114 are also disposed on the gate 111, on the surface of the peripheral gate 201 and on the surface of the peripheral source/drain region 202.

In some embodiment, spacers 115 are formed on opposite side walls of the gate 111 before the conductive plug 114 is formed.

According to the aforementioned description and accompanying drawings, as an example, the active area takes a trapezium-like shape and protrudes the photosensitive doped layer 104. The active area 107 includes: a top side which is horizontal to the surface of the photosensitive doped layer 104, and opposite vertical sides which stand up from the surface of the photosensitive doped layer 104. The gate dielectric layer 110 covers the part of the photosensitive doped layer 104 which is not covered by the active area 107, and covers the top side and opposite vertical sides of the active area 107. The gate 111 covers a corresponding part of the gate dielectric layer 110.

The conductive plug is disposed on the source/drain layer. In some embodiment, the source/drain layer 113 is disposed at the top side of the active area 107. In this way, a MOSFET with vertical-like channel are formed in a pixel region. The photosensitive doped layer 104 and the source/drain layer 113 constitute source and drain regions of the MOSFET. Two opposite vertical sides of the active area 107 constitute the channel of the MOSFET. By doing this, a photo diode is configured below the MOSFET, forming a stacked structure, which means, with a same pixel density, the MOSFET obtained through this stacked structure has a larger channel area compared with a normal transistor which is put side by side with a photo diode on a same plane. Therefore, the noise produced by the switching device can be reduced and a stable performance of the transistor can be resulted in. Accordingly, the size of the photosensitive region and the size of the reading circuit can be balanced with a same pixel density, which is conducive to obtaining good photosensitive performance and switching performance.

Accordingly, some embodiment of the present disclosure also provides a CMOS image sensor manufactured by the aforementioned method. Referring to FIG. 11 and FIG. 12, the CMOS image sensor includes: a substrate 100 including a plurality of pixel regions I which are mutually discrete; a photosensitive doped layer 104 disposed in a pixel region I; and a switching device disposed on the photosensitive doped layer 104.

A switching device is formed on a photosensitive doped layer 104 in a stacked manner. Therefore, an area of a pixel region can be reduced and a pixel density can be improved, and a size of the photosensitive region and a size of the reading circuit can be balanced, which is conducive to obtaining better photosensitive characteristics and switching performance.

In some embodiment, the switching device includes: an active area 107 disposed on a part of the photosensitive doped layer 104, and a gate 111 disposed above and surrounding the active area 107 and above a part of the photosensitive doped layer 104. A source/drain layer 113 is formed at a top of the active area 107, and the gate 111 is provided with an opening 112 which exposes a part of the source/drain layer 113.

In some embodiment, the substrate includes a first region and a second region II. The plurality of pixel regions are mutually discrete and disposed in the first region, and a peripheral device is disposed in the second region II.

In some embodiment, a peripheral device includes: a well region 200 of the peripheral device, a peripheral gate 201 disposed on a part of the well region 200, and a peripheral source/drain region 202 disposed in the well region 200 on both sides of the peripheral gate 201.

In some embodiment, a lightly doped region 108 is disposed at the top of the source/drain layer 113, and the opening 112 exposes a part of the lightly doped region 108.

In some embodiment, a concentration of the lightly doped region 108 ranges from 1E18 atom/cm$^3$ to 1E21 atom/cm$^3$. A doped depth of the lightly doped region 108 ranges from 50 nm to 500 nm.

In some embodiment, the CMOS image sensor also includes: a conductive plug 114 disposed on the source/drain layer 113. A plurality of conductive plugs 114 disposed in the plurality of pixel regions are configured along an extension direction of a plurality of photosensitive doped layers 104.

In some embodiment, the CMOS image sensor also includes an isolation structure 103 which is disposed between adjacent pixel regions and between adjacent switching devices.

Although the present disclosure has been disclosed above, the present disclosure is not limited thereto. Those skilled in the art can modify and vary the embodiments without departing from the spirit and scope of the present disclosure. Therefore, the protection scope of the present disclosure should be based on the scope defined by the claims.

The invention claimed is:

1. A method for forming a CMOS image sensor, comprising:

forming a substrate structure and forming a plurality of photosensitive doped layers, wherein the substrate structure comprises a plurality of pixel regions which are mutually discrete, and one of the plurality of photosensitive doped layers is disposed in one of the plurality of pixel regions; and forming a switching device on the one of the plurality of photosensitive doped layers;

wherein the substrate structure comprises: a substrate, an initial photosensitive doped layer disposed on the substrate, and an initial well doped layer disposed on the initial photosensitive doped layer;

wherein a plurality of isolation structures are formed in the substrate structure, each of the plurality of isolation structures penetrates the initial photosensitive doped layer and is respectively disposed between adjacent pixel regions to form the plurality of mutually discrete photosensitive doped layers, and each of the plurality of isolation structures penetrates the initial well doped layer to form a plurality of well doped layers which are mutually discrete;

wherein the switching device comprises an active area disposed on a part of the one of the plurality of photosensitive doped layers and a gate disposed above and surrounding the active area and above a part of the one of the plurality of photosensitive doped layers, a source/drain layer is formed at the top of the active area, and the gate is provided with an opening which exposes a part of the source/drain layer;

wherein a method for forming the switching device comprises:

etching one of the plurality of well doped layers formed on the one of the plurality of photosensitive doped layers until the one of the plurality of photosensitive doped layers is exposed, thus forming a gate trench, wherein a part of the one of the plurality of well doped layers constitutes the active area, and the active area and one of the plurality of isolation structures are exposed by the gate trench;

forming the gate in the gate trench and above the active area and forming the opening in the gate, wherein the opening exposes a part of the top surface of the active area; and implanting first ions into the opening to form the source/drain layer.

2. The method according to claim 1, wherein a method for forming the substrate structure comprises:

providing an initial substrate; and implanting first doping ions into the initial substrate to form the initial photosensitive doped layer in the initial substrate, the part of the initial substrate disposed under the initial photosensitive doped layer constitutes the substrate, and the part of the initial substrate disposed on the initial photosensitive doped layer constitutes the initial well doped layer.

3. The method according to claim 1, wherein a method for forming the substrate structure comprises:

providing an initial substrate;

implanting first doping ions into the surface part of the initial substrate to form the initial photosensitive doped layer, wherein the initial photosensitive doped layer is located at the top surface of the initial substrate;

forming an epitaxial layer on the top surface of the initial photosensitive doped layer to form the active area; and implanting second doping ions into the epitaxial layer to form the initial well doped layer.

4. The method according to claim 1, wherein a method for forming the gate and the opening comprises:

forming an initial gate in the gate trench and above the active area; and etching back the initial gate until a surface of the one of the plurality of isolation structures and a part of the surface of the active area are exposed to form the gate and the opening.

5. The method according to claim 4, further comprising: forming a gate dielectric layer on surfaces of the gate trench and on the active area before forming the initial gate.

6. The method according to claim 1, further comprising: implanting second ions into a surface layer of the one of the plurality of well doped layers to form an initial lightly doped region before etching the one of the plurality of well doped layers; and forming a lightly doped region after etching the initial lightly doped region.

7. The method according to claim 6, wherein a process for forming the initial lightly doped region comprises: implanting N-type ions, and the dose of N-type ions ranges from 5E12 atom/cm$^2$ to 5E14 atom/cm$^2$.

8. The method according to claim 1, further comprising: after forming the switching device, forming a conductive plug on the source/drain layer.

9. The method according to claim 8, further comprising: forming spacers on opposite side walls of the gate before forming the conductive plug.

10. The method according to claim 1, wherein the substrate structure comprises a first region and a second region, the plurality of pixel regions are disposed in the first region, and a peripheral device is formed in the second region.

* * * * *